United States Patent [19]

Davis et al.

[11] Patent Number: 4,608,649

[45] Date of Patent: * Aug. 26, 1986

[54] DIFFERENTIAL CASCODE VOLTAGE SWITCH (DCVS) MASTER SLICE FOR HIGH EFFICIENCY/CUSTOM DENSITY PHYSICAL DESIGN

[75] Inventors: James W. Davis, Boca Raton; Victor S. Moore, Gainesville; Nandor G. Thoma, Boca Raton, all of Fla.

[73] Assignee: International Business Machines Corporation, Armonk, N.Y.

[*] Notice: The portion of the term of this patent subsequent to Aug. 19, 2003 has been disclaimed.

[21] Appl. No.: 508,451

[22] Filed: Jun. 27, 1983

[51] Int. Cl.⁴ .................. H03K 19/094; H03K 19/173
[52] U.S. Cl. .................... 364/491; 307/465; 307/466; 307/468; 364/490
[58] Field of Search ................ 156/901, 902; 364/488, 364/489, 490, 491; 430/313, 316, 319; 307/465, 466, 467, 468, 469

[56] References Cited

U.S. PATENT DOCUMENTS

| | | | |
|---|---|---|---|
| 3,446,989 | 5/1969 | Allen et al. | 307/454 |
| 3,458,368 | 7/1969 | Haberecht | 430/296 X |
| 3,615,466 | 10/1971 | Sahni | 430/313 X |
| 3,618,201 | 11/1971 | Makimoto et al. | 430/313 X |
| 3,643,232 | 2/1972 | Kilby | 307/465 |
| 3,925,684 | 12/1975 | Gaskill, Jr. et al. | 307/467 |
| 3,978,329 | 8/1976 | Baugh et al. | 364/785 |
| 4,161,662 | 7/1979 | Malcolm et al. | 307/469 X |
| 4,196,228 | 4/1980 | Priel et al. | 430/313 X |
| 4,213,117 | 7/1980 | Kembo et al. | 364/490 X |
| 4,249,193 | 2/1981 | Balyoz et al. | 357/40 |
| 4,255,672 | 3/1981 | Ohno et al. | 307/467 |
| 4,295,149 | 10/1981 | Balyoz et al. | 357/45 |

OTHER PUBLICATIONS

Article: "A High Density Bipolar Logic Masterslice for Small Systems," J. Z. Chen, et al, IBM J. Res. Develop. vol. 25, No. 3, May 1981, pp. 142-151.

"Bipolar Circuit Design for a 5000-Circuit VLSI Gate Array"; by Dansky, IBM J. Res. Develop.; vol. 25: No. 3, May 1981.

"Microelectronics" a Scientific American Book, published by W. H. Freeman and Co.; Sep. 1977, pp. 1,40, and 42.

Primary Examiner—Errol A. Krass
Assistant Examiner—Edward R. Cosimano

[57] ABSTRACT

A topological physical circuit design is utilized for the support of a Differential Cascode Voltage Switch circuit/logic technology in an Automated Placement-Wiring environment. This physical entity takes the form of a "brickwall" set of transistors in a Master Slice image which may be stored and later personalized.

2 Claims, 23 Drawing Figures

MASTER SLICE FABRICATION FIG. 2A
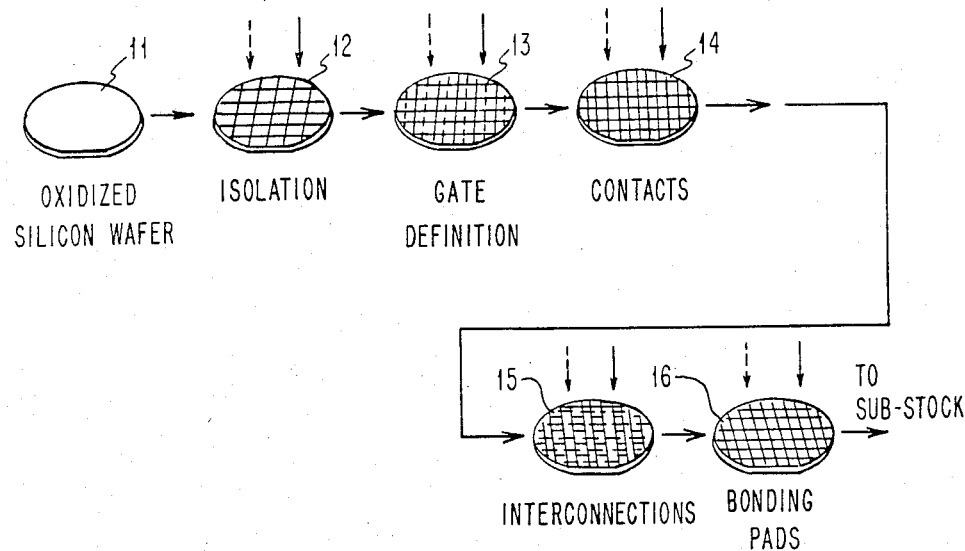
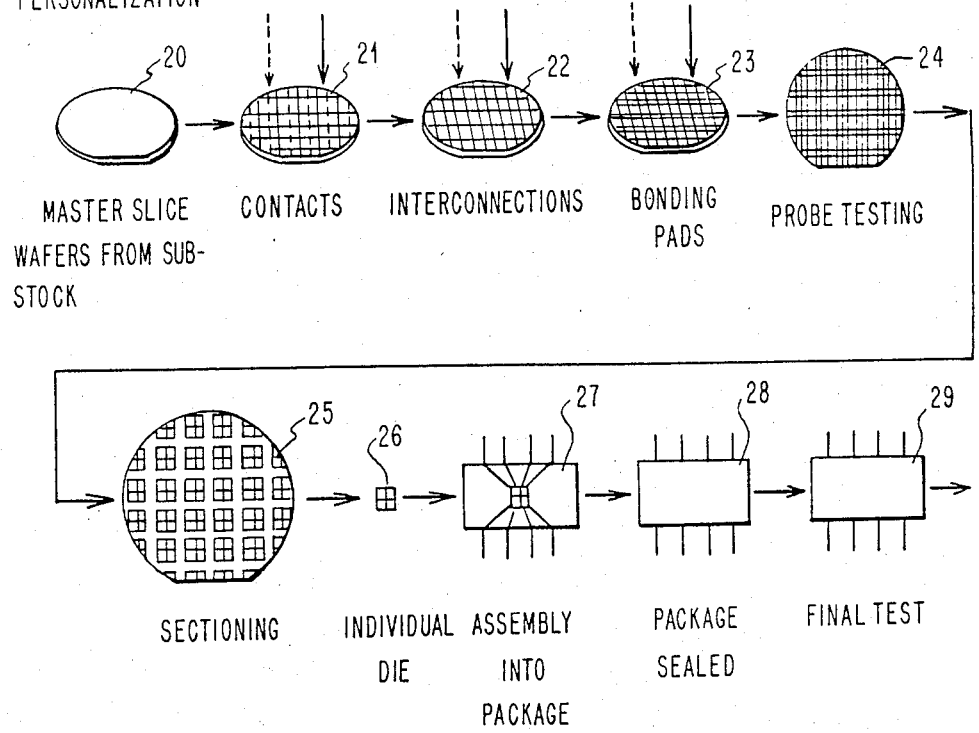

DCCS
BIPOLAR
CASCODE
LOGIC

CMOS
FET
CASCODE
LOGIC

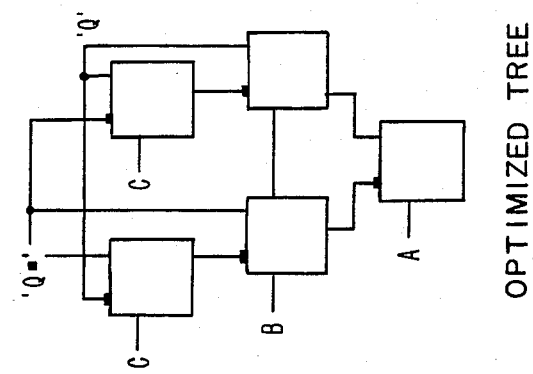
FIG. 5C  OPTIMIZED TREE
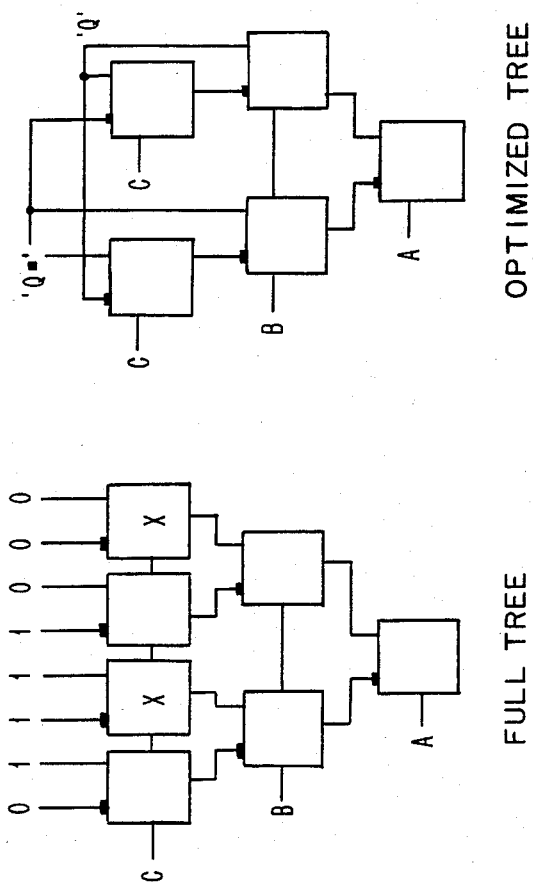
FIG. 5B  FULL TREE
FIG. 5A
3 VARIABLE TABLE
| A | B | C | 'Q' |
|---|---|---|-----|
| 0 | 0 | 0 | 0 |
| 0 | 0 | 1 | 0 |
| 0 | 1 | 0 | 0 |
| 0 | 1 | 1 | 1 |
| 1 | 0 | 0 | 1 |
| 1 | 0 | 1 | 1 |
| 1 | 1 | 0 | 1 |
| 1 | 1 | 1 | 0 |

DCVS DESIGN METHODOLOGY

DCVS DESIGN METHODOLOGY

MACHINE DIAGRAM

LOGIC GROUPS

LONGEST PATH DELALY

| PATH | DELAY | LEGAL DELAY |
|------|-------|-------------|
| ABDE | 14 | ---> 9 ---- |
| ADE | 10 | <-------- |
| ACE | 8 | |

4/ = WORSTCASE/
 2           LEGAL

LOGIC VALIDATION

GENERIC TABLE        NETWORK EXPRESSION

| INPUTS | | | OUTPUTS | | | |
|---|---|---|---|---|---|---|
| A | B | C | F0 | F1 | F2 | Q=$\overline{ABC}+\overline{A}B\overline{C}+ABC$ |
| 0 | 0 | 0 | 1 | 2 | 1 | 0 |
| 0 | 0 | 1 | 1 | 1 | 0 | 1 |
| 0 | 1 | 0 | 1 | 1 | 0 | 1 |
| 0 | 1 | 1 | 0 | 0 | 1 | 0 |
| 1 | 0 | 0 | 1 | 0 | 0 | 0 |
| 1 | 0 | 1 | 0 | 0 | 1 | 0 |
| 1 | 1 | 0 | 0 | 0 | 1 | 0 |
| 1 | 1 | 1 | 0 | 2 | 0 | 1 |

LOGIC GROUP CLUSTER PLACEMENT

TREE CLUSTER PLACEMENT

MICROBLOCK FINAL PHASE PLACEMENT

DIFFERENTIAL CASCODE VOLTAGE SWITCH (DCVS) MASTER SLICE FOR HIGH EFFICIENCY/CUSTOM DENSITY PHYSICAL DESIGN

CROSS REFERENCE TO RELATED APPLICATIONS

Cross reference is made to a number of patent applications each having a common filing date and a common assignee with the present application. These patent applications are as follows:

U.S. patent application Ser. No. 508,440, filed June 27, 1983 entitled "Differential Cascode Current Switch (DCCS) Master Slice for High Efficiency/Custom Density Physical Design" having as an inventor J. W. Davis.

U.S. patent application Ser. No. 508,454, June 27, 1983, now abandoned, entitled "A Differential CMOS Logic Circuit with an Efficient Load Means" having as inventors J. W. Davis and N. G. Thoma.

U.S. patent application Ser. No. 508,393, filed June 27, 1983 entitled "Field Effect Transistor (FET) Cascode Current Switch (FCCS)" having as inventors J. W. Davis and F. D. Jones.

BACKGROUND OF THE INVENTION

This invention relates to Very Large Scale Integrated (VLSI) microelectronic circuits and more particularly to a more efficient utilization of master slices in the production of such circuits.

The evolution of microelectronics has been discussed in many books and articles. For example, in the Scientific American book entitled "Microelectronics", published in 1977 by W. H. Freeman and Co. the book-publishing affiliate of Scientific American, a variety of individual articles address the nature of microelectronic elements, their design and fabrication particularly in the form of Large Scale Integrated Circuits, their applications, and their impact for the future.

The IBM Journal of Research and Development has had a number of articles from time to time concerning various microelectronics technologies of this nature which are included in the May 1981 issue: "VLSI Circuit Design", the May 1982 issue: "Packaging Technology" and the September 1982 issue: "Semiconductor Manufacturing Technology".

Complementary Metal Oxide Semiconductor (CMOS) technologies are of special interest in the present patent application. Other Metal Oxide Semiconductor (MOS) technologies are set forth in the Scientific American book. A number of other manufacturing techniques of basic interest are also described, in the Scientific American book. As one example, on page 42 thereof Large Scale Integrated circuits may be produced by computer control by proceeding through a number of steps including the use of optical techniques for generating topological patterns.

Other items of interest to microelectronics fabrication in particular, including master slice layout, logic cell layout and arrangements for achieving high density in such circuits include the following:

Technical Disclosure Bulletin article number PO 141,578 entitled "Cascode Decoder" by J. E. Gersbach and J. K. Shortle, published September 1965, Vol. 8, No. 4 at pp. 642–643 which concerns closely controlled input voltages, differentially connected to the inputs of a cascode decoder thereby providing high speed operation with minimum power dissipation.

Technical Disclosure Bulletin article number FI871-0895 entitled "Bipolar FET High-Speed Logic Switch" by R. D. Lane, published May 1972, Vol. 14, No. 12 at pp. 3684–3685 relating to the high speed operation of both positive and negative transitions at low power in a bipolar transistor current switch circuit by the provision of a pair of cross-connected field-effect transistor (FET) loads for the current switch bipolar transistors.

Technical Disclosure Bulletin article number MA877-0019 entitled "Merged Transistor Logic Cell for Logic Master Slice Layout" by H. R. Gates published March 1978, Vol. 20, No. 10 at p. 4013. This article relates to a logic cell layout which minimizes channel blocking for an integrated injection logic master slice array.

Technical Disclosure Bulletin article number GE878-0041 entitled "Integrated Logic Cell Array Layout" by K. Helwig published January 1980, Vol. 22, No. 8A, pp. 3258–3259 which concerns the density and/or wiring capabilities of a merged transistor logic (MTL) array that can be improved by placing MTL cells in the X and Y directions adjacent to a common injector region.

Technical Disclosure Bulletin article number FR876-0335 entitled "Generation of Mask Layout from Topological Equations" by B. Vergnieres published December 1980, Vol. 23, No. 7A, pp. 2833–2835 provides for the combination of manual design and automatic design automation which together provides the greatest flexibility, rapidity and density for manufactured integrated circuits.

Technical Disclosure Bulletin article number EN880-0261 entitled "Cascode Parity Circuit" by E. L. Carter and H. T. Ward published August 1981, Vol. 24, No. 3, pp. 1705–1706 providing for a customized cascode current switch circuit which facilitates parity generation with fewer logic stages than conventional circuits.

U.S. Pat. No. 3,233,223 to F. K. Buelow et al which provides for a high speed trigger having an output after a single transistor delay.

U.S. Pat. No. 3,446,989 to F. G. Allen et al having the provision of a multiple level integrated semiconductor logic circuit connected and operative to control a bistable element.

U.S. Pat. No. 3,475,621 to A. Weinberger relating to high-density integrated circuit arrangements for generating complex logical functions that include combinational and sequential logic.

U.S. Pat. No. 3,760,190 to C. W. Hannaford using a multiple input latching circuit which responds to the satisfaction of any one or more of a plurality of predetermined input signal conditions by the production of an output signal persisting, until reset, irrespective of any change in the input signals.

U.S. Pat. No. 3,978,329 to C. R. Baugh et al relating particularly to digital logic circuits for performing digital arithmetic functions.

U.S. Pat. No. 4,176,287 to J. J. Remedi concerns digital decoders for decoding digital signals and especially a CMOS decoder capable of providing one or more of n decoded outputs.

U.S. Pat. No. 4,249,193 to J. Balyoz et al concerning an improved masterslice design technique including structure, wiring and method of fabricating thereby providing improved Large Scale Integrated Devices.

U.S. Pat. No. 4,295,149 to J. Balyoz et al which utilizes improved LSI semiconductor design structures thereby enabling increased density and optimized performance of semiconductor devices, circuits and part number functions.

In the production of microelectronic circuitry heretofore a generalized approach has been the use of macro logic elements. In usual practice, the macro logic elements have been maintained in a library for access as needed for circuit production. Usually a number of the macro elements have been combined in order to produce a finished chip or logic product. The macro libraries have to be individually designed until a critical number of library entities are arrived at before a generalized logic machine can be efficiently implemented using them. The design of a full set might take many years to complete thus resulting in difficulty in designing an efficient desired finished product. Further, the physical images used during circuit production and derived from the macros referred to are further constrained as a result of the macro concepts.

The primary objective of the present invention is to overcome inherent limitations imposed heretofore due to use of macro concepts in DCVS circuit fabrication.

SUMMARY OF THE INVENTION

In accordance with the present invention, all macro logic elements utilized for microelectronic logic fabrication are decomposed into their most primitive elements. This enables design of equivalent logic in a more generalized compact fashion.

In the practice of the present invention, significant advantages are realized by greater flexibility in circuit design, timesaving, and elimination of the complications encountered with the previously used macro concepts. Further advantages result from the use of a small closed macro set all of which simplifies or enhances the automation of processes required to achieve the end logic product.

In the preferred embodiment described, a topological physical design is utilized for the support of a Differential Cascode Voltage Switch circuit/logic technology in an Automated Placement-Wiring environment. This physical entity takes the form of a "brickwall" set of transistors in a Master Slice image.

For a better understanding of the present invention, together with other and further advantages and features thereof, reference is made to the description taken in connection with the accompanying drawings, the scope of the invention being pointed out in the appended claims.

BRIEF DESCRIPTION OF THE DRAWINGS

Referring to the drawings:

FIG. 1A illustrates a master slice in its entirety utilizing Differential Cascode Voltage Switch (DCVS) technology while

FIG. 2A illustrates the production steps in fabricating a master slice and FIG. 2B illustrates the steps in personalizing a master slice into an end product.

FIGS. 5A, 5B and 5C serve as a symbolic representation of the cascode tree of FIG. 3 and FIG. 4.

Abbreviations

The following abbreviations are occasionally used herein:

| Abbreviation | Definition |
| --- | --- |
| A, B, C, D, E, Q | Boolean Variable Labels |
| A21, A22, C21-R21 | Machine Diagram Logic Group Labels |
| BDLC/S | Basic Design Language Control/Structure - a high level hardware descriptive and modelling language |
| BDLS | Basic Design Language Structure a logic block interconnect language |
| DCVS | Differential Cascode Voltage Switch |
| DOR | Differential OR, DCVS microblock |
| FET | Field Effect Transistor, a term for either an MOS or a CMOS transistor |
| GL/1 | Graphic Language 1 - a vector format graphics design language |
| IDL | Interactive Design Language - essentially same function as BDLC/S |
| I/0 | Input/Output |
| L/P | Logical to Physical |
| LSSD | Level Sensitive Scan (Design) |
| LST | Logic Service Terminal |
| PLA | Programmable Logic Array |
| SRL | Shift Register Latch |
| TPG | Test Pattern Generation |
| TX | Transistor |
| VDD | Positive Power Supply Label |
| VLSI | Very Large Scale Integration |
| VMS | Variable Mesh Simulator - performs Boolean and timing logic validation |

DETAILED DESCRIPTION

Described here is a design concept which enables cascode logic to become a generalized logic technology. This design concept is based on dealing with the technology in its most granular form in describing a product's logical and physical essence. This provides the basis for dealing with the technology in a software intensive environment providing the high productivity necessary for generalizing the logic technology. Exploiting this design methodology in a VLSI master slice environment yields high productivity in both the logical and physical design phases of the product.

Figure 1A:
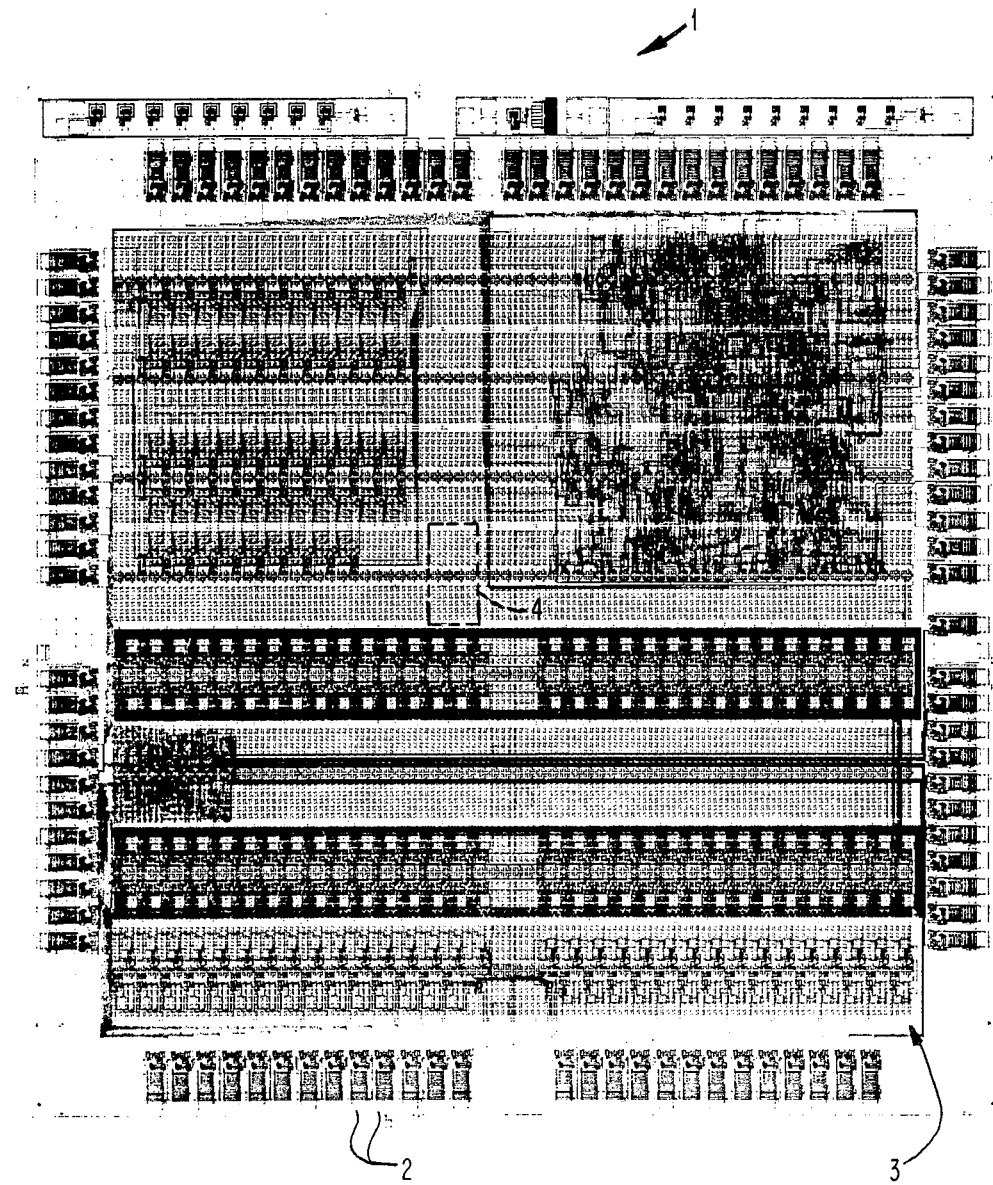
Figure 1B:
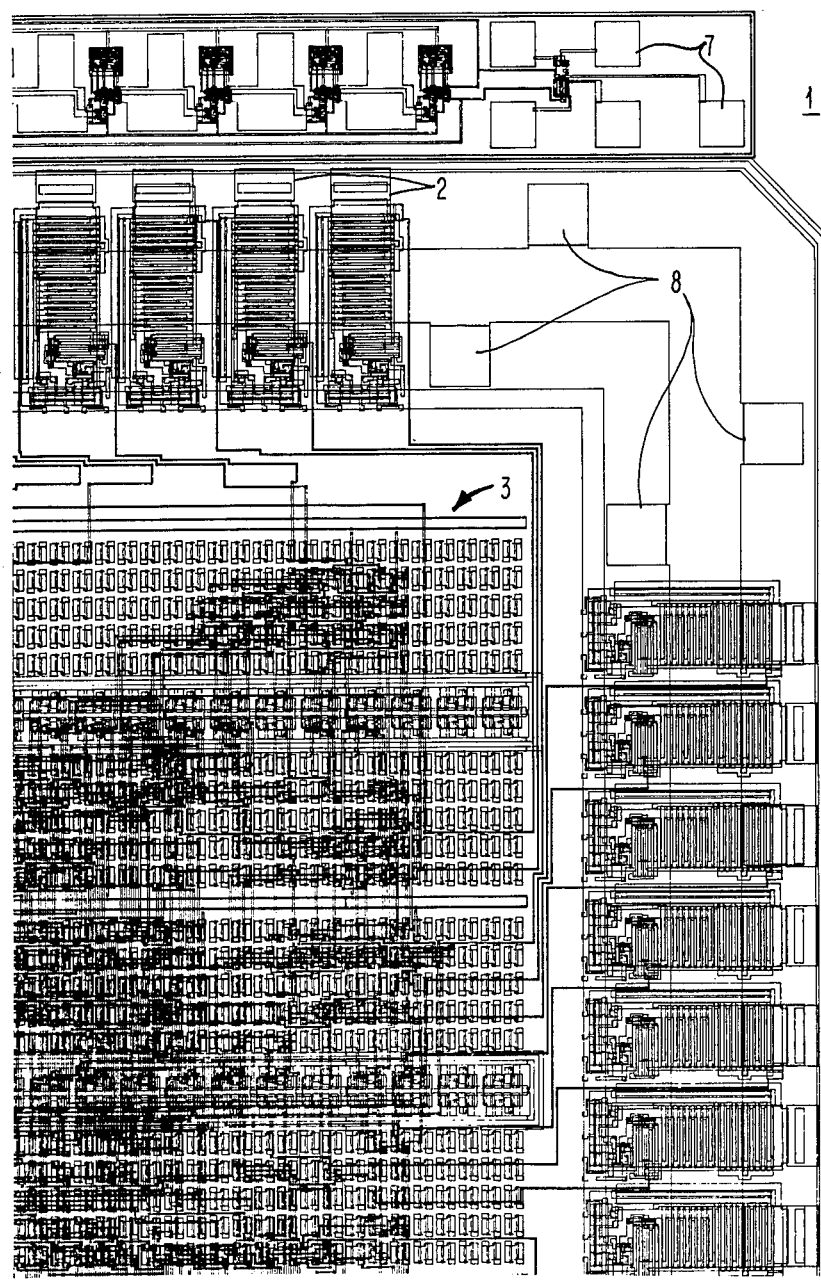
FIG. 1B represents a portion of the master slice, more specifically the upper right corner.

A VLSI master slice 1 supporting the differential cascode voltage switch (DCVS) CMOS embodiment of cascode logic is illustrated in FIGS. 1A and 1B. As indicated in FIG. 1A, master slice 1 is comprised of two general areas, an input/output cell perimeter 2 with off-chip driver receiver circuits and a cascode logic array 3. A portion 4 of the cascode logic array, will be described later, in connection with FIG. 12. An enlarged view of the upper right corner of master slice 1 is shown in FIG. 1B. This illustrates the input/output cell perimeter 2, logic array 3, a test area including test points 7 (only a few so designated) and power connector points 8. A primary attribute of fabricating a logical product in a master slice environment is an abbreviated production time. This reduced processing time is accomplished by virtue of the fact that the master slices are preprocessed through a number of the fabricating steps and stockpiled in a substock. Functional products need only to be processed through the remaining, reduced number of fabrication steps.

FIG. 2A illustrates the actual fabrication of a master slice for placement into substock. This fabrication consists of six stages designated 11 through 16. The fabrication process begins with an oxidized semiconductor electronic quality wafer, such as silicon wafer stage 11. Wafers of other composition may be utilized depending on the technology. This silicon wafer is further processed to produce devices of both N and P polarity to form Complementary Metal Oxide Semiconductor array. For further information concerning a process of this nature reference is made to the article entitled "HMOS-CMOS—A Low-Power High Performance Technology" having Ken Yu et al as authors that appeared in the IEEE Journal of Solid State Circuits, Vol. SC-16, No. 5, October 1981, pp. 454–459. Such a process has a two orthogonal wiring plane capability. At the conclusion of stage 16, the vertical structures of all the active components on the wafer are complete. Upon completion of stage 16, the master slice wafers are stock piled in substock available for personalization into logic products. What remains to be processed are the contact holes and interconnection of the passive and active devices to complete the physical design of a logical function.

The final processing or personalization phase begins with retrieval of the required number of master slices from substock and proceeding through the interconnection phases of the process at stage 20, FIG. 2B. Contact holes are opened for the active and passive components, stage 21 and interconnected with metal wiring on multiple planes interconnected further with conducting interplane vias in stage 22. Processing continues with the bonding of pads stage 23 to the logic service terminals probe testing of the completed personalized wafer in stage 24, sectioning the wafer in stage 25 into die and sorting out good die in stage 26. The final phase involves assembling the sorted good die from stage 26 into a package stage 27, sealing that package in stage 28 and processing that package through a final test stage 29. The foregoing procedures result in reduced processing time for each product in that only stages 20 through 29 must be performed to complete the definition of each product designed against the master slice in substock.

A software intensive design system supporting both bipolar and FET master slice versions of cascode logic is described here having both high productivity and abbreviated processing time. A short tutorial on cascode logic is now presented in order to establish a further basis for understanding the description of the preferred embodiment set forth herein.

Design System, DCCS Technology, and Cascode Logic Circuitry

Cascode logic has superior power-performance attributes compared to other logic circuit technologies, but a variety of factors have prevented it from becoming a generalized logic technology. A software intensive design system supporting both Bipolar and FET master slice versions of cascode logic is described here having high productivity characteristics necessary for the general support of the technology.

Figure 3:
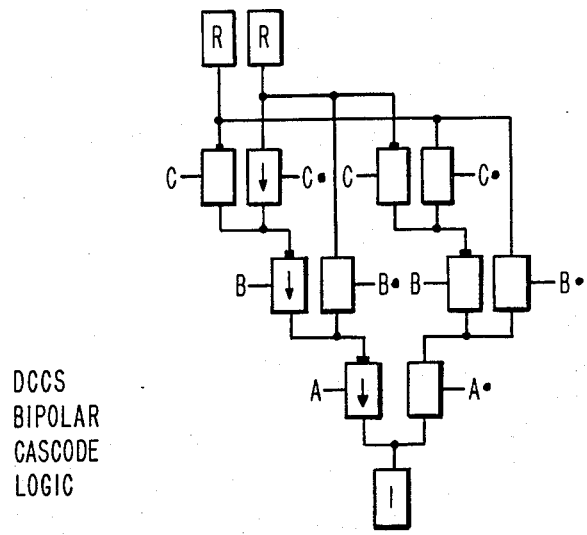
FIG. 3 shows a three level differential cascode current switch logic tree.

Cascode Logic is easily understood through the examination of a Bipolar embodiment, the Differential Cascode Current Switch, DCCS. DCCS is a differentially coupled current mode logic family, as its name implies, that exhibits the inherent speed of emitter coupled logic while distributing its circuit power over an expansive logic function. FIG. 3 illustrates a three level DCCS logic with logic elements R and I positive variables A, B, and C and negative variables A·, B·, and C·. A constant current source sets the unit of power the DCCS tree will consume in performing its designed logical function. Logical operations are accomplished through selectively steering the tree current through various paths within the tree to one of two binary output summation points. Current steering is accomplished by applying differential logic signals to each differential set of transistors in the tree, selecting the devices that will allow current to pass. The path indicated in FIG. 3 by arrows, represents the resultant current path through the tree when the variable 'A' and 'B' are true, or at a positive potential and variable 'C' is false, or at a negative potential.

The DCCS tree of FIG. 3, is represented in symbolic form by FIGS. 5A, 5B and 5C. The actual tree configuration is directly derived from the three variable truth table in FIG. 5A. An output vector 'Q' is developed from the complete conditional table of three variables. Since the problem involves three variables, it suggests the use of a three high DCCS tree, FIG. 5B. The output vector 'Q' is transposed across the top of the full three level tree expansion. The 'Q' output vector across the top of the tree associates each tree output point with either the '1' or '0' conditional path. The convention is that current flow propagates a logical '0'. Connecting each output point to its respective termination point, yields a three level cascode tree configured to provide the 'Q' output vector response to the various input conditions. Further examination of the tree configuration reveals apparent redundancy represented by the "X" blocks in FIG. 5B, and 'don't care' states that may be exploited in order to minimize the tree. This minimized result is illustrated by FIG. 5C. The example suggests that any Boolean problem concerned with three variables may be solved by a single three high DCCS tree. This can be further demonstrated by developing various other output vectors from the conditional table given and configuring the tree solutions in the same manner as the example. It now follows that any 'n' variable Boolean expression may be solved by a single 'n' high DCCS tree.

Figure 4:
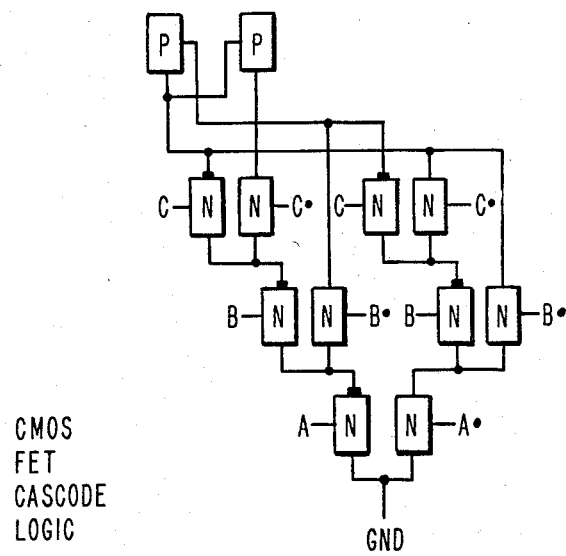
FIG. 4 illustrates an example of a three-high cascode tree in Complementary Metal Oxide Semiconductor (CMOS) field effect transistor (FET) technology.

These conclusions demonstrate the functional power of cascode logic and convey a similar message for the electrical attributes of the technology. This functional power is achieved in the speed and within the power dissipation of a single level logic gate. FIG. 4 illustrates an example of a three high cascode tree implemented in CMOS FET technology with elements P and N. These implementations have exactly the same functional and electrical attributes, within their respective technological arenas. Given the obvious power of the cascode logic technology, it is an ideal candidate in which to implement VLSI machines.

To realistically pursue VLSI machine designs, it is necessary to have a method of dealing with the problem as a whole in a highly productive design cycle. Pre-VLSI machine design methodologies allowed for the partitioning of the machine into 'independent' elements of the size and complexity a designer could deal with at a primitive level. This partitioning could be somewhat crude and still not greatly impact the overall machine primitive level design. Partitioning was essentially limited and dictated by what could be supported on the less dense integrated chips of that era. With the advent of VLSI and upward of 10,000 logic gates (or more) available on a single piece of silicon, the problem must be approached differently. Optimization of both the high level structure and primitive implementation is necessary to fully realize the potential of VLSI. To this end the Cascode Logic Design methodology illustrated by the flow diagram of FIGS. 6A and 6B entitled "DCCS Design Methodology" has been developed.

As can be seen from the diagram, the design system is driven from a high level modeling facility. The design system is presently compatible with IDL and BDLC/S as a means of developing and simulating high level machine models. A strategic high level modeling tool comprising a high level language and compiler (High Level Design and Simulation, FIG. 6A) is utilized to model and simulate the high level machine, and also to optimize it. All these tools essentially provide the same service with varying degrees of efficiency, that is, to allow the machine architect to deal with the entire problem. These high level tools all interface with the Cascode Logic Design System through generic descriptions of the various machine functional partitions.

These generic descriptions take the form of logic maps or functional truth tables that represent the complete set of functional conditions the primitive logic must eventually emulate. The high level tool actually passes a set of generic logic maps to the design system, each representing a machine sub-function or partition. These generic logic maps are similar to PLA pictures in that they represent a set of output vectors dependent upon the conditions of a set of input variables. The design system deals with the set of logic groups as a synchronous sequential machine, such that each performs a designated machine sub-function in a time spaced relationship to other logic groups or machine sub-functions.

Figure 7:
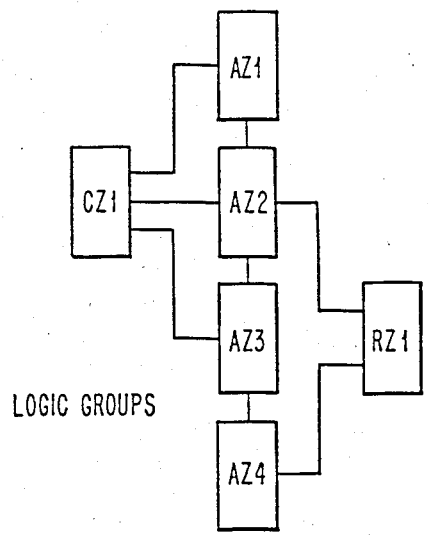
FIG. 7 illustrates a digital machine, diagramed in terms of logic groups.

A diagram illustrating a machine configuration in terms of logic groups is given by FIG. 7 entitled "Machine Diagram". An LSSD latch is appended to the input of each logic group and becomes the mechanism for clocking the system. Each logic group is clocked, completes its assigned tasks and passes its output to the next sequential partition during the next clock phase. The LSSD latches, as well as other machine register resources, are passed into the design system as 'Black Box' elements. The high level modeling tool also passes some extraneous information along with the machine description: driver/receiver types, switching groups, I/O preassignment, and a 'machine' level objective function. The objective function sets the relative priority of the system optimization parameters: delay, power and area. This objective function is applied to all the machine partitions or logic groups during the first pass through the design system as the high level generic tables are transformed into DCCS cascode tree networks.

The generic logic maps, representing clocked logic groups, are decomposed into DCVS tree networks by a decomposition algorithm (Decompose into Cascode Logic, FIG. 6A) described in the article entitled "The Decomposition and Factorization of Boolean Expressions" by R. K. Brayton and Curt McMullen, IEEE ISCAS 1982 (Institute of Electrical and Electronic Engineers International Symposium on Circuits and Systems). This algorithm works upon the machine one logic group at a time. The algorithm minimizes each logic group output vector Boolean expression and decomposes it into a set of expressions that can be implemented in a cascode logic network of trees. The algorithm must be tree height sensitive, and allows the user to specify the desired maximum tree height. This algorithm has its own internal objective function, to find a solution with the fewest number of trees having the fewest number of devices. The algorithm does not consider signal level translators or early-late signal arrival and performs variable level assignment within each tree to effect minimum number of devices. The algorithm therefore yields only a partial cascode logic solution that further be manipulated to arrive at an optimal logic network solution.

The decomposition result is further manipulated by an optimization phase in the design flow. This phase of the design system assumes that the decomposition result is an optimal solution for the parameters it considered. Based on this assumption, it's an objective of this design phase to minimally effect the decomposition result. The task performed here, for a Bipolar implementation, is to complete the DCCS description by the inclusion of the necessary signal level translators (Introduce Trans. Bipolar Optimize Logic, FIG. 6A). An emitter follower is assigned to each logic group primary input at the LSSD latch in anticipation of heavy signal loading, by the Register Resource Module. An internal objective function of this algorithm is to introduce the fewest number of power consuming emitter follower level translators as possible. The algorithm assumes that all primary input variables from the logic group LSSD latches are available from any signal level with no additional emitter follower cost. Considering these translators, the algorithm strives to maximize primary input level assignment requiring translation and minimize the translation of internal trees.

Statistics are collected from the decomposition result as to the variable level assignment for optimal trees, trees having a minimum number of devices. These statistics are used to establish an optimal level assignment for each network variable. A simplified example might be variable 'A' found assigned to signal level '4' for twenty of its twenty-five occurrences in the logic group being optimized. This would suggest an objective function for the level assignment of variable 'A' to signal level '4' in order to have minimum effect on the optimal tree solution from decomposition. The algorithm would also attempt to resolve the level assignment for variable 'A' to signal level '4' in the remaining five trees in order to enhance the physical design concerning wire routing from the translator. The algorithm attempts to anticipate the physical design phase of the design flow and relates multiple signal routing from a single point source, the input SRL, as a detrimental wiring impact. The algorithm deals with loading on variables in a similar way. If a particular variable load exceeds the specified maximum from a single emitter follower, a second is introduced into the solution. The algorithm utilizes this circumstance to give the variable two single level assignments with no additional cost over the load requirement and again attempts to anticipate the physical design phase and minimize the wiring impact. The algorithm attempts to associate two distinct groups of trees, as independent as possible, with the two emitter followers. The heuristic measures the tree interdependence as the number of common or shared variables in each tree and asserts that trees sharing many variables will be placed in close proximity and trees with only a single variable in common will not be placed in close proximity. The algorithm, by this grouping, has attempted to decongest the wiring demand by diverting the point source to two different destinations. The only remaining tool this segment of optimization can employ to accomplish translation and not increase the emitter follower cost is in-line translation. These translators are devices in-line with the cascode logic tree output terminal that translate the tree output signal level itself. These devices are subject to their own set of technology rules, such as tree height and loading, which are scrutinized by the algorithm before their application. This segment of the design flow provides an optimal Bipolar cascode logic solution for a machine level problem.

At this point in the design flow, both the FET and Bipolar solutions are ready to be optimized against the user specified machine objective function. The FET decomposition result is still intact since it doesn't require signal level translators. The cascode logic levels within a single FET tree are all driven with the same signal swing. The Bipolar solution is considered optimal in that is reflects the minimum number of emitter follower translators, least effecting the original decomposition result. The machine objective function is passed into the design system along with the complete generic machine description. The objective function is in the form of a set of numeric weights resolving the priority for optimization of three parameters: machine speed, machine power dissipation, and the number of devices necessary to implement the design. These numeric weights are applied as constants in a set of simultaneous equations represented in a linear optimization model. The decomposition solution, after translator introduction for Bipolar, serves as a basis for further parametric optimization directed by the machine objective function. It represents the optimal solution for two of the three optimization parameters: number of devices and units of power. This solution does not necessarily represent an optimal primary output delay. The optimization model is then employed in determining how to optimize discrete logic group primary outputs in order to effect a uniform logic group delay pattern.

Figure 8:
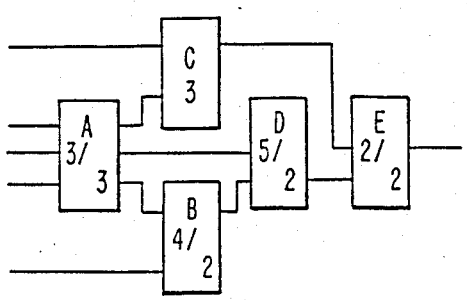
FIG. 8 represents algorithmic determination of the longest path delay through a logic group.

The delay algorithm determines the worst case delay for each tree in the logic, based on technology delay equations and the worst case path through the tree. The worst case path through a tree is defined as the path incurring the maximum number of intermediate nodes through the maximum number of cascode levels. These worst case delays are listed for each tree in the logic group. The primary output networks are interrogated as graphs by a routing algorithm to determine the longest path delays for each network. The algorithm considers early-late signal ordering and cascode level delay dependencies in its computation of the primary output delay. These delays are in turn listed as the path delays of the logic group primary outputs. The algorithm identifies the primary output with the longest delay and interrogates its tree network further to reflect legal logical conditions. A legal logic condition is defined to be the subset of all possible Boolean variable combinations that can actually occur in the defined logic network without logical contradiction. These are logical conditions that can occur simultaneously, such as resolving a single variable condition to either true or false. This validated delay is now offered as the primary output delay and is compared to the remaining logic group primary output delays in order to determine if it is still the longest path delay. If it is still the longest path, the logic group interrogation is complete, and its delay is equated with the longest path delay. If another primary output is found to now exceed the desired delay, it is interrogated for legal condition and processing continues until a longest path delay is found. This sequence is illustrated in FIG. 8 by finding the longest legal primary output path. The logic group is completely characterized at this point in the design flow with an accounting for devices and power units and distribution of the primary output delays. It's an objective at this point to force the primary output delays into a uniform distribution with some specified criteria defining the bounds of the distribution. The longest path delays are modified to meet this uniformity criteria through variable level reassignment and tree powering, as directed by the costing optimization model. The machine objective function will vary this interactive modification depending on the associated cost of the parameters that effect change compared against the initial objective function. The completion of this phase represents an optimized primitive level design emulating the high level machine model and ready for further processing to the point of user review.

The machine diagram, such as illustrated in FIG. 7, which includes for example, blocks CZ1, AZ1–AZ4 and RZ1, is updated with the various logic group longest path delays and interrogated for clock generation. This algorithm (Generate clocks, FIG. 6A) determines the fastest rate at which the time spaced logic groups can be clocked. The algorithm resolves the clock specification to the clock rate, the number of clock phases and a logic to phase relationship. Upon determining the clock rate and phase requirement, the algorithm completes the definition of the clock generator 'Black Box' (essentially an LSSD clock ring) and appends the clock generation logic to the primitive logic. The complete machine primitive logic expansion, including the various 'Black Box' elements are encoded in a logic descriptive language. This level of the design serves as the basis for primitive logic validation and further processing to realize a physical design.

Figure 6A:
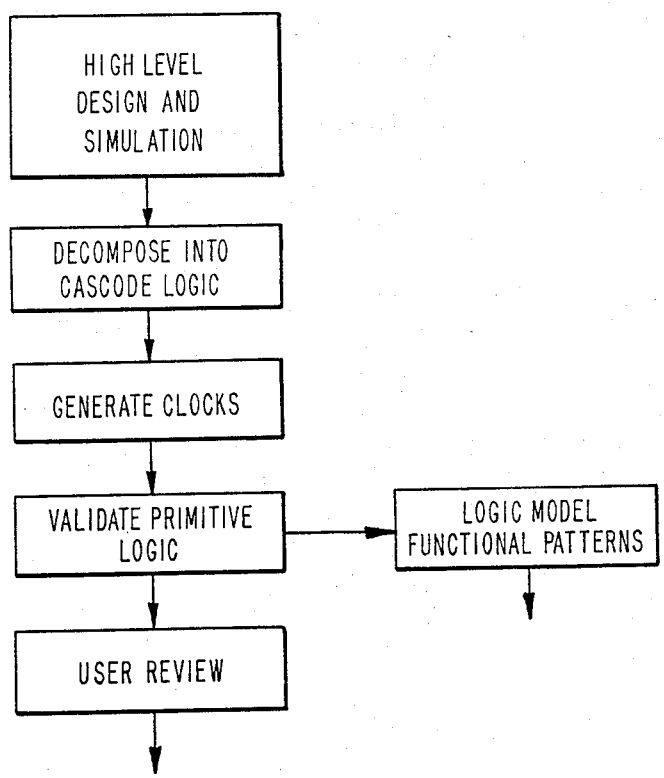
FIGS. 6A and 6B illustrate a flow diagram representing the DCVS design methodology.
Figure 6B:
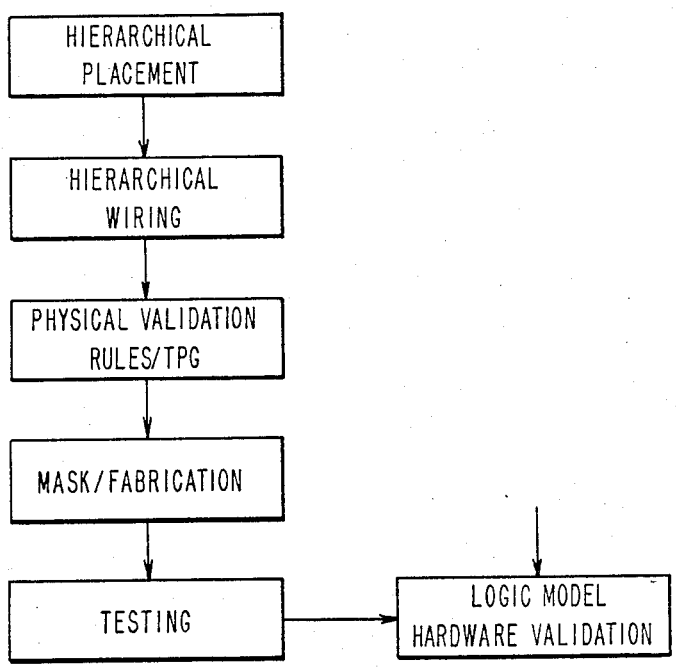
Figure 9:
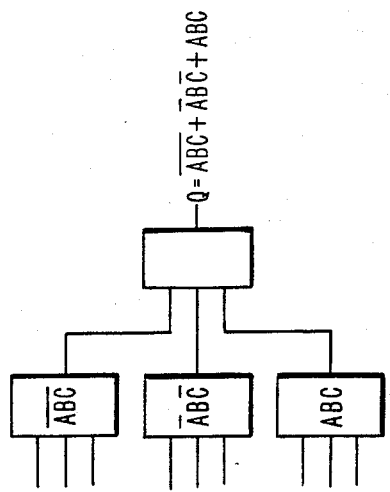
FIG. 9 illustrates a logic group primary output to generic logic map output vector comparison.

Logic validation (Validate Primitive Logic in conjunction with Logic Model Functional Patterns, FIG. 6A) is essentially accomplished by comparing the primitive level design to the high level generic logic map that inspired it. The first level of validation is between the logic group machine diagram and high level model machine structure. This validation is accomplished by constructing a machine diagram from the high level model in terms of the various generic logic map elements. The algorithm associates each logic group with its high level generic logic map equivalent and determines that both machine diagrams represent the same configuration. The next validation phase is to insure that the high level generic logic maps have been mapped with integrity to the primitive level. This is accomplished by formulating the Boolean output expressions for each logic group primary output and comparing it to generic logic map output vector it was designed to emulate. This logic group primary output to generic logic map output vector comparison is illustrated in FIG. 9. As can be seen in the figure, the algorithm must formulate Boolean output expressions for each of the trees contributing to the primary output expression and derive the final expression. The algorithm must associate each logic group with its generic logic map equivalent and further resolve an association between the generic logic map output vectors and the logic group primary outputs. The example illustrated in FIG. 9 relates the formulation of logic group primary output 'Q' and its comparison to a generic logic map output vector 'F1'. At the conclusion of this logic validation phase the primitive logic is known to accurately reflect the simulated high level model. This validation coupled with the extensive timing analysis of the optimization phase constitutes primitive level design that can be committed to a physical design upon user review (User Review, FIG. 6A) and acceptance.

The physical design phase is driven from a BDLS master file derived from the validated encoded primitive logic description. This same BDLS master file also supports the LSSD Rules and TPG phase of the design flow, and to this end represents the LSSD latch elements in predefined macro form. These macros must be expanded to their microblock level before proceeding into the placement phase of the physical design. This expanded BDLS also supports the physical to logical audit of the final design. The expanded BDLS is transformed into a Master Logic List (MLL) in order to interface with the placement phase of the design flow.

Figure 10A:
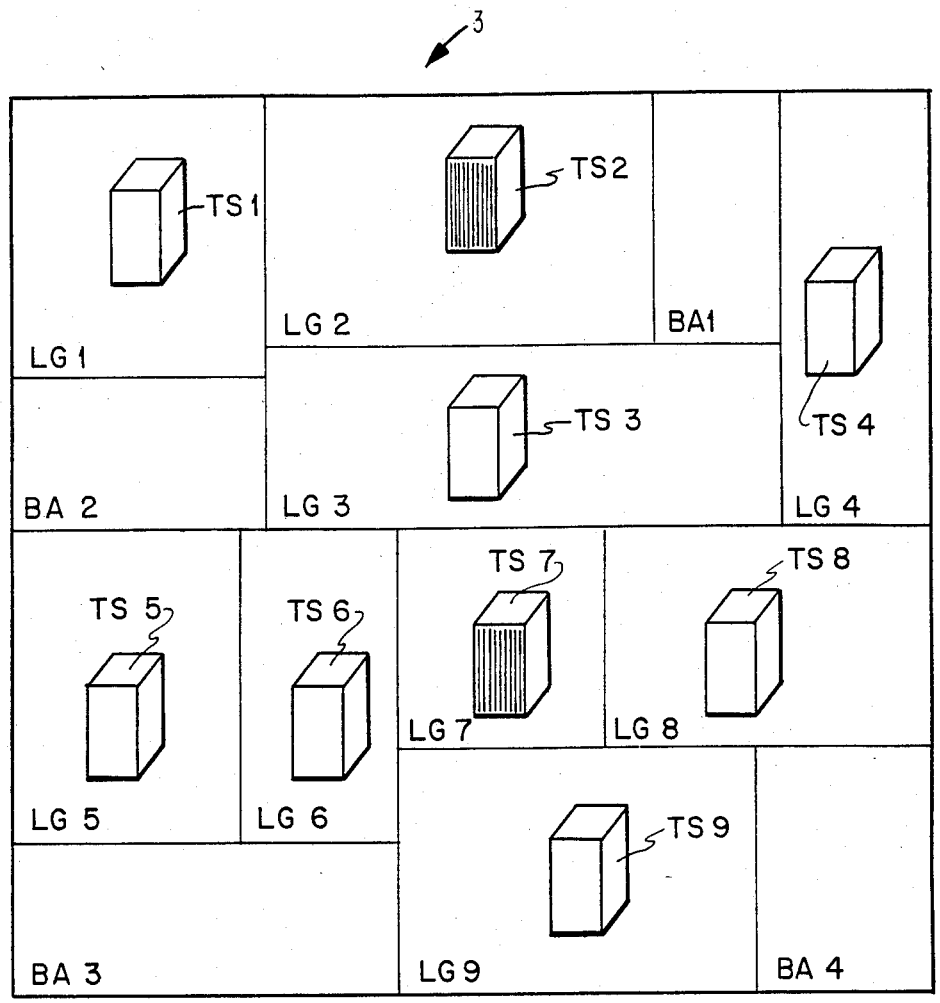
FIGS. 10A, 10B and 10C represent a hierarchical placement approach starting at a very high machine level passing through an intermediate stage and resolving to the microblock placement.
Figure 10B:
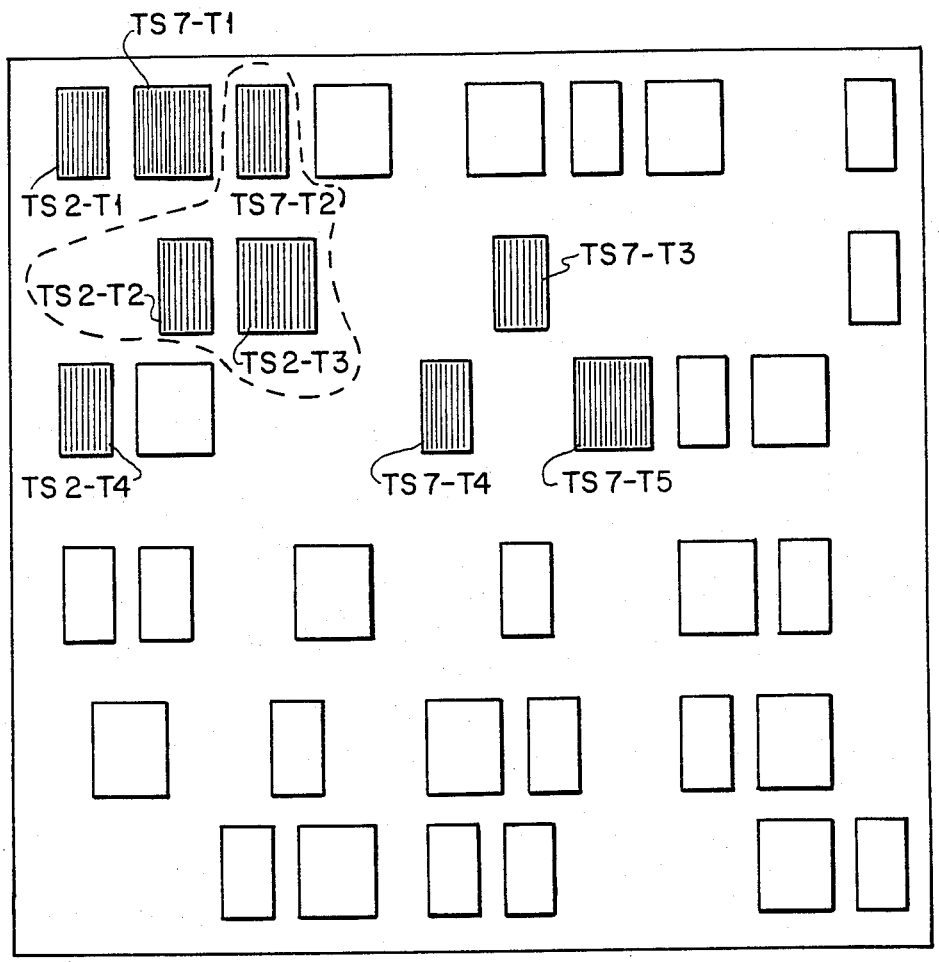
Figure 10C:
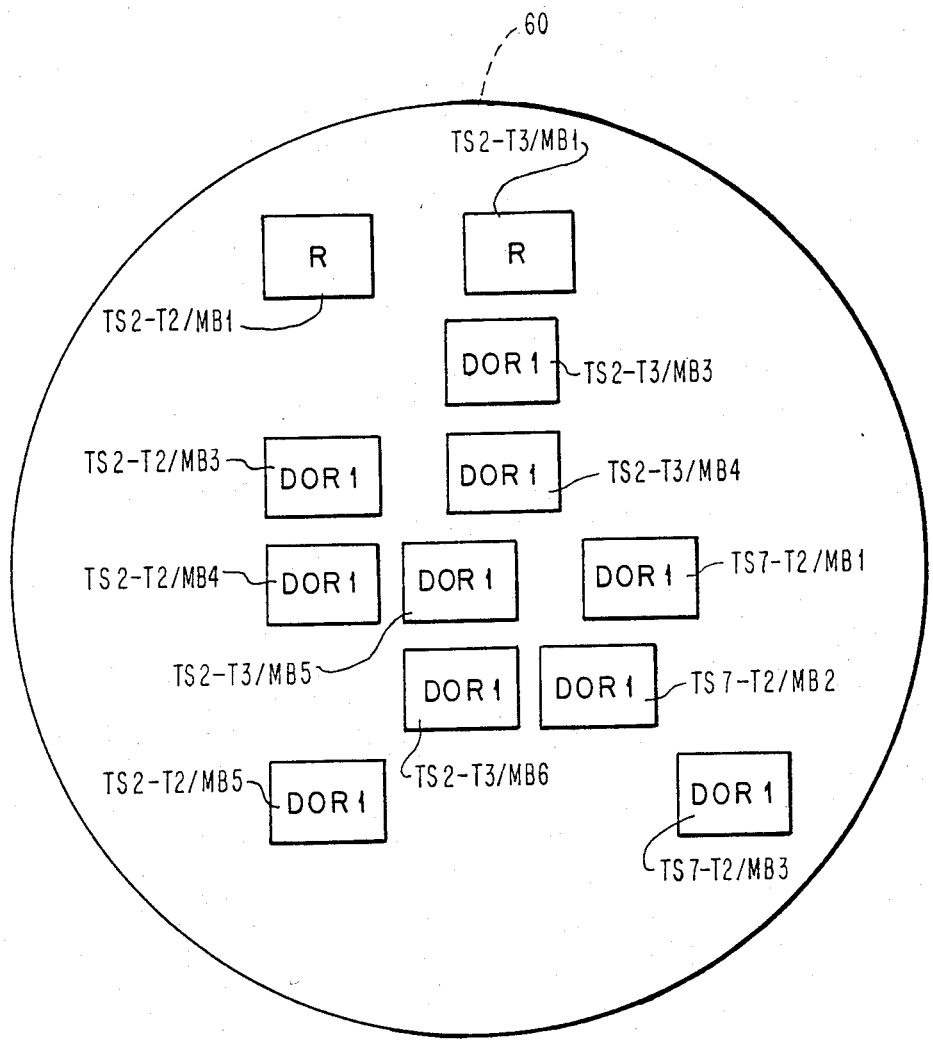

Placement is based on a hierarchical methodology (Hierarchical Placement, FIG. 6B) that resolves the machine level placement problem to the cascode logic microblocks, differential pairs of devices, load devices, current sink devices, etc. The placement task is performed with a routine described in an article entitled "Optimization by Simulated Annealing" by S. Kirkpatrick, C. D. Gelatt, Jr., and N. P. Vecchi published May 1983 in the magazine Science. Conceptually the placement algorithm attempts to find an optimal physical placement for the cascode logic microblocks described by the MLL file. This yields a placement where each microblock position has been optimized to minimize the subsequent wiring problem. The cascode trees are now free for elements accentuating the wiring phase. Placement is derived hierarchically from the logic group machine diagram, through a pseudo tree phase to the actual cascode logic microblocks, illustrated by FIGS. 10A, 10B and 10C. The placement algorithm is a Monte Carlo algorithm and therefore benefits greatly through seeding the placement with a reduced number of objects, in terms of improving its efficiency. The first phase of this seeding is based on resolving a relative placement for each logic group in the machine diagram, LG1 through LG9 in FIG. 10A. FIGS. 10A, 10B and 10C represent a hierarchial approach to the ultimate placement of the microblocks configuring an entire chip level physical function and utilization of the master slice concept for the support of the Differential Cascode Voltage Switch Technology. As indicated, FIG. 10A illustrates a number of machine logic groups LG1 through LG9 placed against the complete master slice logic array reference 3.

Each logic group is associated dimensionally with its primitive logic demand in terms of the number of trees and number of microblocks it encompasses. The chip image is completely resolved with either component demand of logic groups or uncommitted areas such as BA1 through BA4 of FIG. 10A. The placement must deal with fewer than one hundred objects at this phase and can resolve a placement relatively quickly. This phase of placement is followed by a tree placement phase. Essentially, the logic group pseudo boundary is displaced by a cascode tree pseudo boundary. The sets of cascode trees, TS1 through TS9 in FIG. 10A are unpacked into the multiplicity of cascode trees, TS2-T1, TS2-T2 etc. in FIG. 10B. The placement algorithm now attempts to resolve placement of these cascode trees that make up the logic groups. The tree placement has been relatively resolved during the logic group placement phase such that further resolution will take place within some bounded space less than that of the full image. This phase of placement is also relatively fast in that the algorithm is concerned with fewer than fifteen hundred objects. The final placement phase eliminates the cascode tree pseudo boundary and allows the algorithm to resolve a final placement for tree microblock elements. The multiplicity of cascode trees, TS2-T1, TS2-T2 etc. in FIG. 10B, are further resolved to the microblock level, TS2-T2/MB1, TS2-T2/MB2 etc. in FIG. 10C. This phase again resolves the microblock placement within a relatively small bounded space but requires the algorithm to deal with many more objects. This is obviously the most time consuming placement phase, but yields the final microblock placement against which the wiring algorithm is exercised.

The wiring algorithm (Hierarchical Wiring, FIG. 6B) employed to wire this microblock placement is an enhanced Lee algorithm. The Lee algorithm is described in the article entitled "An algorithm for Path Connections and Its Applications, IRE Trans. on Electronic Computers, September 1961, pp.346-365. Also see the article entitled "The Interconnection Problem—A Tutorial" by David W. Hightower of Bell Telephone Laboratories, Inc. published in Proceedings, 10th Design Automation Workshop, June 1973. This algorithm is a maze runner algorithm with 'rip-up/lay-down' capability. A 'rip-up/lay-down' capability consists of identifying a blocking network, removing the network, wiring the previously failed network, and then re-wiring the original networks that were removed in order to make the changes. The algorithm makes provision to avoid 'rip-up/lay-down' loops through assignment of channel ownership to the newly interconnected wire. During the course of wiring the microblock placement the algorithm may find, in a high wire demand area, the LST it is attempting to route a wire to is completely blocked by 'owned' channels. This circumstance constitutes a failed net. At this point the wiring program halts execution and recalls the placement algorithm. The placement algorithm then regions the chip image into bounding rectangles and attempts to identify the regions in the minimum spanning tree path for the failed net.

Next, the placement algorithm proceeds to redistribute the microblocks within the minimum spanning tree path regions. This redistribution is scheduled to a particular 'annealing schedule' and proceeds until its conclusion. The algorithm is scoring the chip image and the region boundaries during this phase and improves the original wire demand across these boundaries to overcome the congestion causing the failed net. Upon completion of redistribution, this new placement is passed back to the wiring program which continues wiring, including rewiring of the nets affected by the redistribution. This process continues until all failed nets have been overcome and the placement is completely wired. The design is then audited (Physical Validation Rules/TPG, FIG. 6B) for physical to logical correspondence, technology groundrule violations and its correspondence to the TPG file. At the conclusion of these audits, the design can be submitted to manufacturing (Mask/Fabrication, FIG. 6B, and Testing, FIG. 6B, in conjunction with Logic Model Hardware Validation, FIG. 6B).

The machine design flow from the users' perspective has been to model and simulate the machine to satisfaction in a high level environment. The machine design is then submitted for cascode logic transformation. The user reviews primitive level implementations in both Bipolar and FET, makes a technology choice, and either optimizes the design further or commits it to physical design. This sequence culminates in a software description of the desired hardware design and serves as an input for actual physical fabrication.

This design system represents a design environment that allows the machine architect to totally control the end product. It further reduces the machine development cycle to such an extent that it affords the architect unprecedented opportunity to actually resolve an optimal machine design.

FURTHER DETAILED DESCRIPTION OF PREFERRED EMBODIMENT

Figure 11:
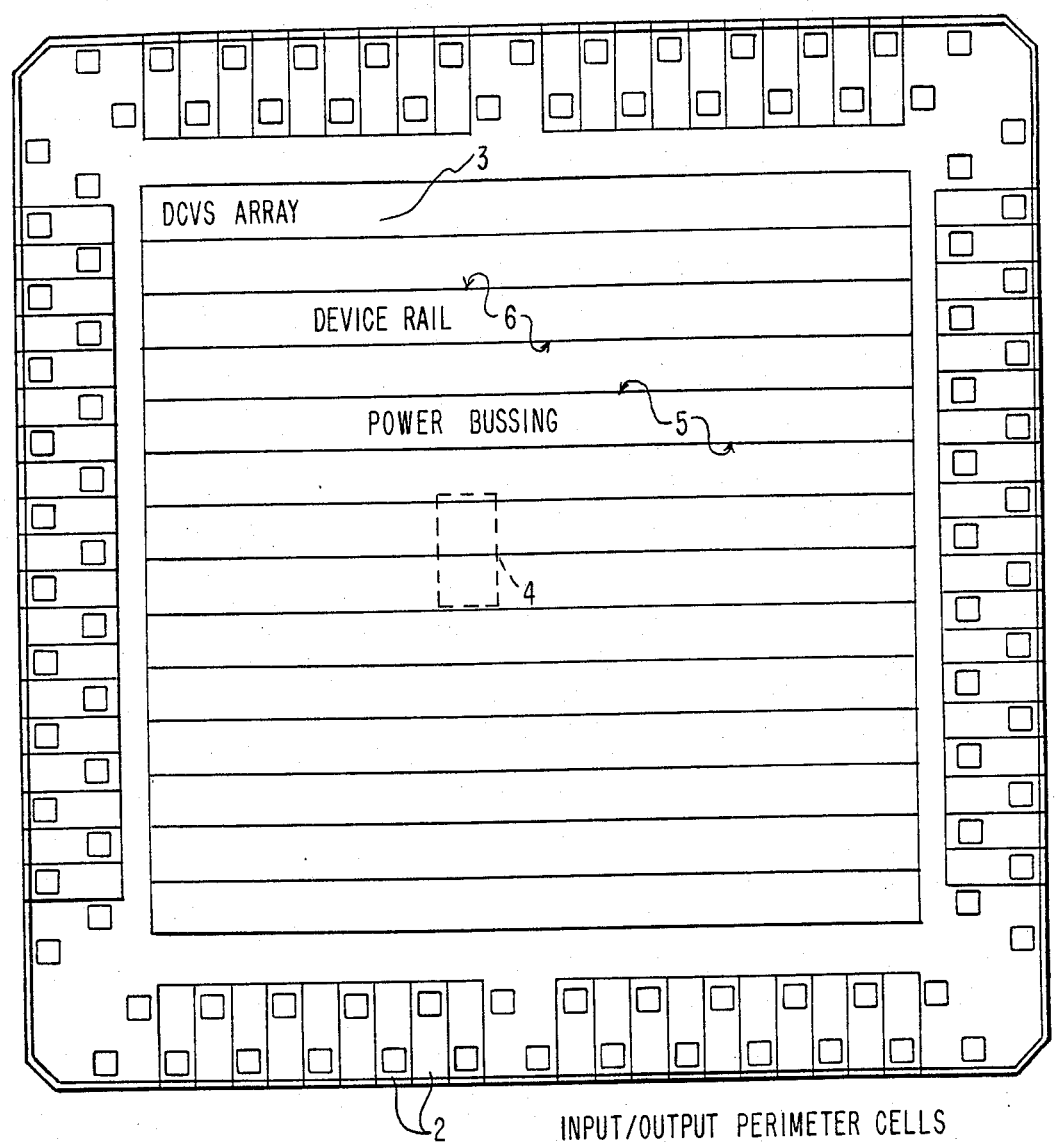
FIG. 11 is a symbolic representation of the master slice shown in FIGS. 1A and 1B.
Figure 12:
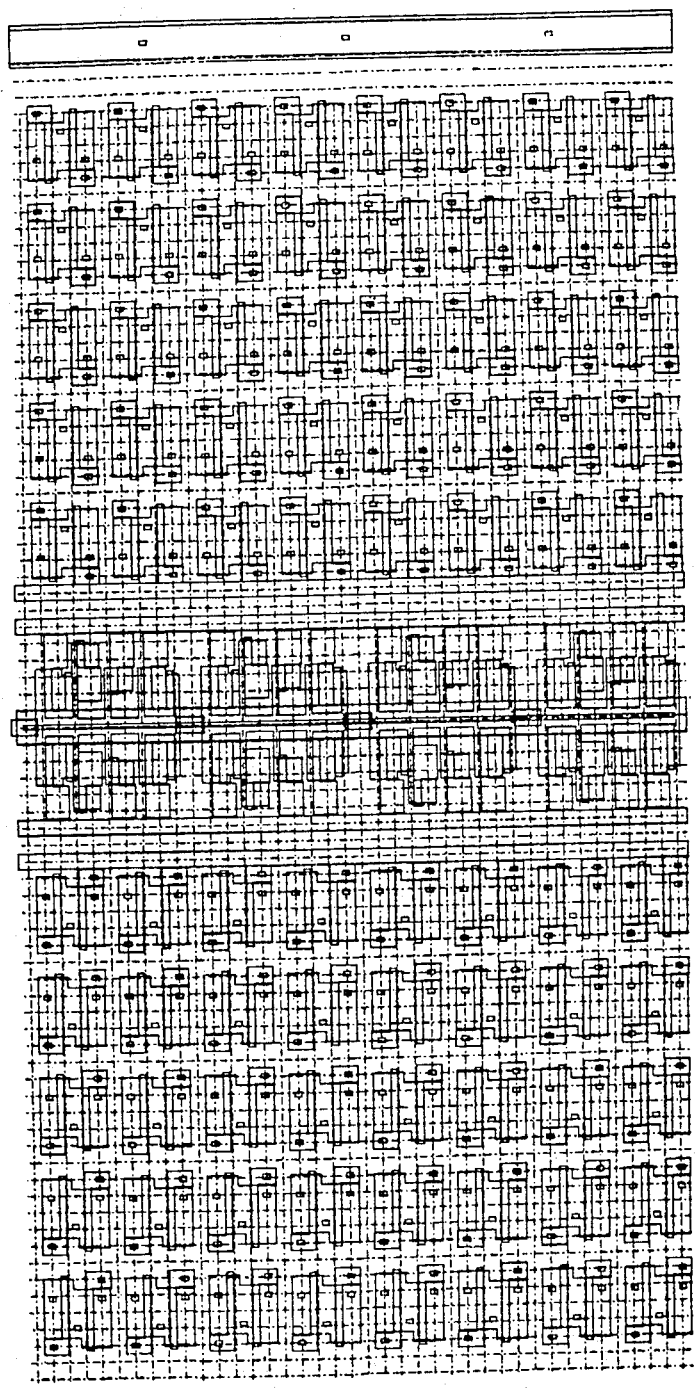
FIG. 12 is an exploded view at the device level of a portion of the master slice in FIGS. 1A and 1B.
Figure 13:
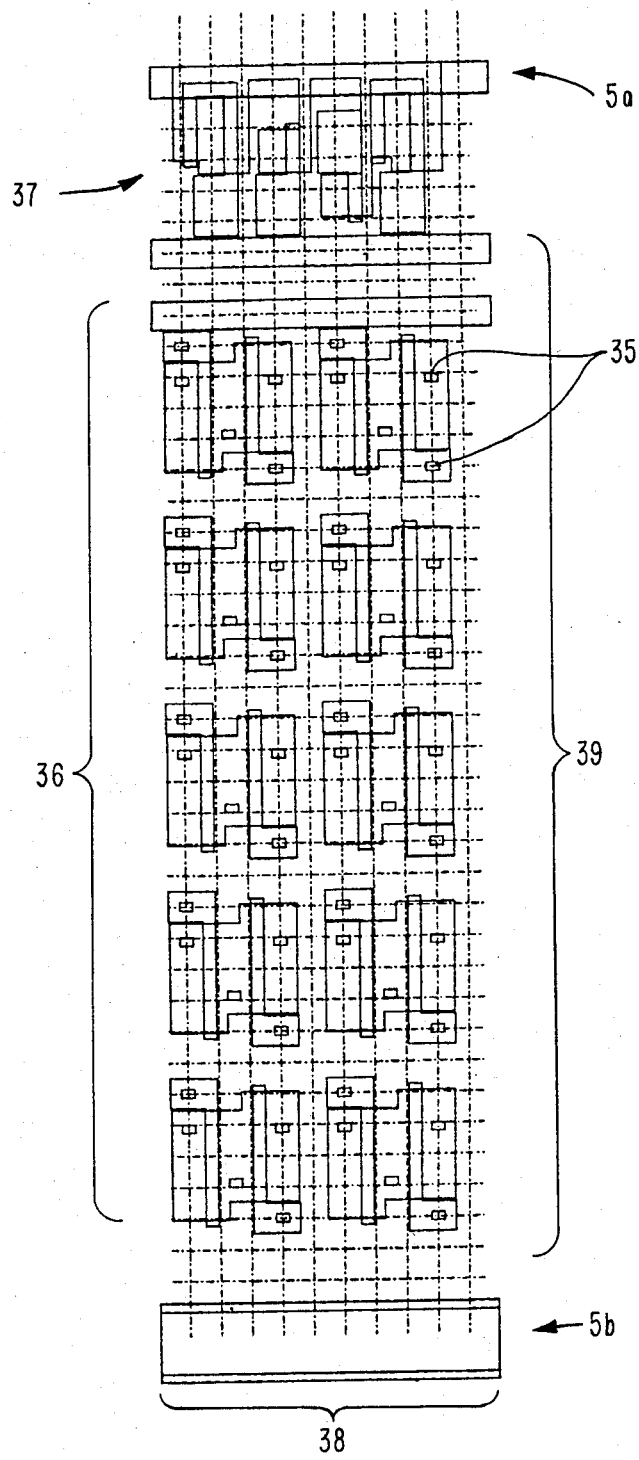
FIG. 13 is a symbolic view of the wiring channels for the master slice.
Figure 14:
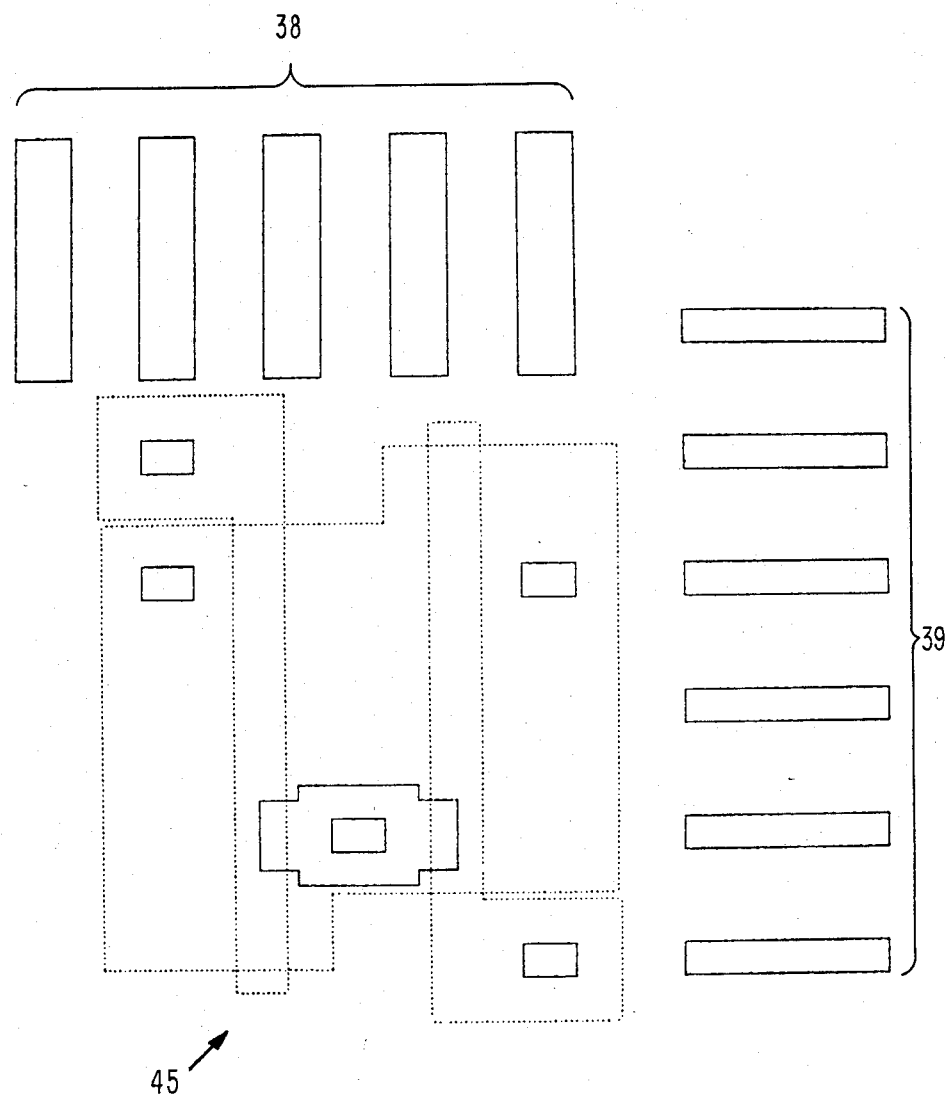
FIG. 14 is a combination, actual and symbolic representation of one of the technology microblocks comprising a differential pair of transistors.

The master slice designed to exploit the aforementioned design concepts and the cascode logic technology is illustrated in symbolic form in FIG. 11. As noted in connection with FIG. 1A or 1B master slice 1 is comprised of two general areas, an input/output cell perimeter 2 and a DCVS logic array area 3. The DCVS logic array area is essentially a brickwall set of MOS transistors arranged into device rails 6 delimited by power bussing 5. The device rails are further illustrated by the DCVS logic array exploded portion 4 in FIG. 12. FIG. 12 illustrates device level detail of a master slice and represents a complete device structure requiring only personalization contact holes and interconnect metal in order to form a functional logic product. A portion of the device rail 6 in FIG. 12 is illustrated in FIG. 13. The device rail structure includes power rails 5a to VDD and 5b to Ground. These devices are a centralized "brickwall", a minimally spaced array consisting of five consecutive rows of discrete logic devices 36 vertically arranged above the current source row. These devices are then followed by a row of complementary output transistors elements 37 located adjacent to power rail 5a. Representations of areas where contacts may be opened during personalization are shown for the logic devices as 35. Also illustrated in FIG. 13 are the device interconnect wiring channels, vertical channels 38 and horizontal channels 39, utilized to interconnect the active components of the DCVS logic array into a logical function. The physical design is accomplished through the placement and interconnection of DCVS primitive microblocks against this generalized logic array area. One such microblock is illustrated in FIG. 14 by reference 45. Microblock 45 is illustrated with the available wiring channels in the vertical direction 38 and horizontal direction 39 utilized for interconnection with other such microblocks to form a complete physical interconnect of a logical product. The Microblock 45 in FIG. 14 is comprised of a set of symbolic outer rectangular shapes encompassing the actual mask level contact holes necessary for personalization of these devices.

Figure 15:
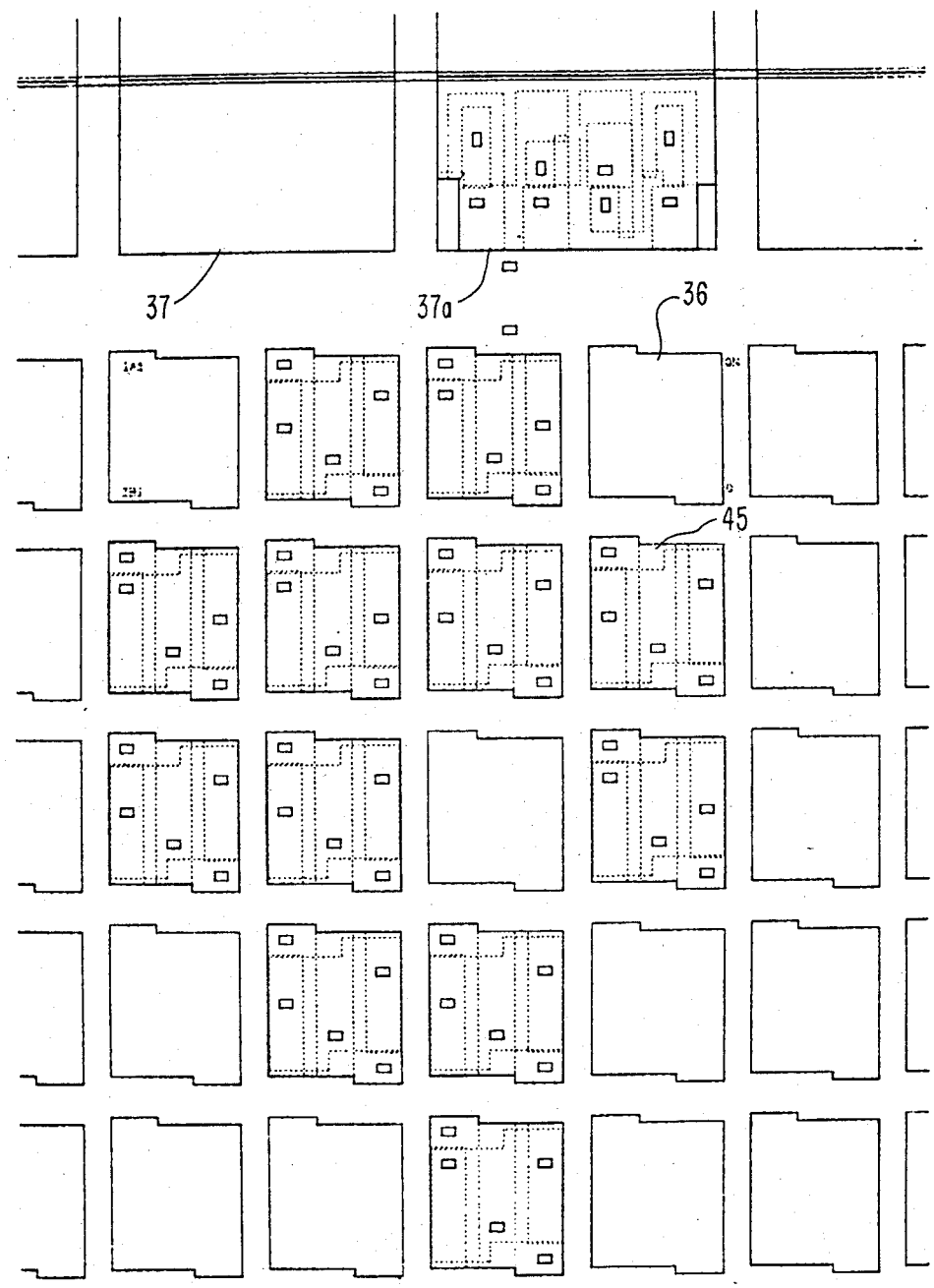
FIG. 15 represents the application of the technology microblocks including the microblock of FIG. 14 on the complete master slice symbolic image of FIG. 11.
Figure 16:
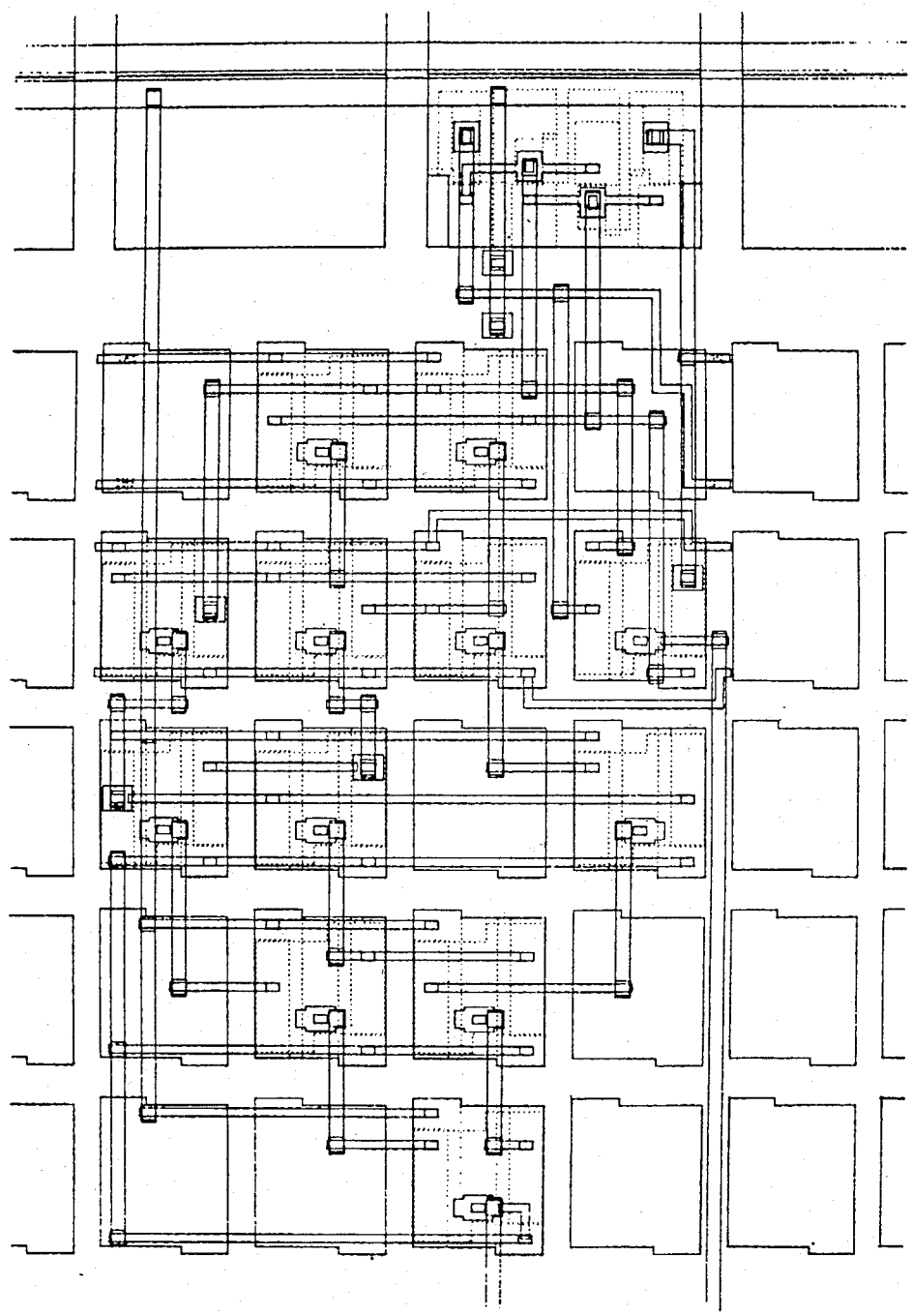
FIG. 16 represents an example of a set of microblocks placed and interconnected in order to form a section of a computer function.

Application of microblocks to the physical image is further illustrated by FIG. 15. FIG. 15 represents the application of a load device microblock 37a against the background image of the master slice represented by physical symbolic target 37. The symbolic target 37 has been overlayed with load element microblock 37a completing the device vertical structure to now include the contact holes necessary for interconnecting this device with other devices in the logic network. FIG. 15 also illustrates the application of logic microblock 45 against the physical symbolic target reference 36. The essence of this master slice design concept exploiting cascode logic at its most granular microblock level is provided by FIG. 16. FIG. 16 represents a section of a computer processor dataflow that has been described logically at the microblock level. This microblock description is used to ascertain the appropriate placement for each individual microblock weighing its impact upon the various other microblocks of the circuit solution and the impact of the other microblocks upon it. The notion is to derive wiring freeways between devices exactly and precisely where required based on the interrelationship of all the microblocks configuring the solution.

Thus, a significant aspect of this invention is the discovery that differential cascode voltage switch can be dealt with both logically and physically at this microblock level. As has been described and illustrated, a logical description of an eventual logic product can be derived in term of this very granular microblock level. This logical description can be transposed and dealt with at this same microblock level into a physical design.

While a preferred embodiment of the invention has been illustrated and described, it is to be understood that there is no intention to limit the invention to the precise construction herein disclosed and the right is reserved to all changes and modifications coming within the scope of the invention as defined in the appended claims.

What is claimed:
1. A method of fabricating a master slice wafer for stockpiling in a substock awaiting further steps in defining a completed functional product incorporating Differential Cascode Voltage Switch (DCVS) circuits, comprising:
 (1) locating a silicon wafer; and
 (2) processing said wafer to establish an isolation region, a source/drain diffusion region, and a polysilicon gate region thereon, whereby the vertical structures of all the active components on the wafer is complete, the processing steps being controlled to produce a completed masterslice comprised of two general areas of microblocks including an input/output cell perimeter and a DCVS logic array of MOS transistors arranged into device rails including associated power rails, the mi- croblocks including said MOS transistors being cascoded into binary decision trees for developing logic signals and setting current levels.

2. The method of claim 1 comprising further steps to personalize the DCVS master slice wafer from substock for DCVS applications, comprising the steps of:

(1) further processing said master slice wafer by opening contact holes for active and passive components, selectively interconnecting said elements with metal wiring planes connecting to logic terminals thereon to thereby produce a completed personalized wafer, the further processing steps being controlled in accordance with a design methodology that comprises developing primitive logic form such as tree networks or gate array interconnects in DCVS cascode logic from generic descriptions such as logic maps and truth tables of various machine functional partitions, producing primitive logic machine diagrams with various logic groups and longest path delays, generating clocks from machine diamgrams validating and optimizing the primitive logic, and determining heirarchical placement, and hierarchical wiring, generating test pattern; and (2) probe testing the completed personalized wafer, sectioning said wafer into die, sorting out good die, assembling each sorted good die into a package, and testing and performing logic model hardward validation.

* * * * *